United States Patent
Lu et al.

(10) Patent No.: US 8,618,640 B2
(45) Date of Patent: Dec. 31, 2013

(54) METHOD OF SHIELDING THROUGH SILICON VIAS IN A PASSIVE INTERPOSER

(75) Inventors: Hsiang-Tai Lu, Zhubei (TW);
Chih-Hsien Lin, Tai-Chung (TW);
Meng-Lin Chung, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 103 days.

(21) Appl. No.: 13/194,033

(22) Filed: Jul. 29, 2011

(65) Prior Publication Data

US 2013/0026612 A1    Jan. 31, 2013

(51) Int. Cl.
*H01L 23/552* (2006.01)

(52) U.S. Cl.
USPC ..... 257/659; 257/508; 257/774; 257/E23.174

(58) Field of Classification Search
USPC ............................ 257/659, 508, 774, E23.174
See application file for complete search history.

(56) References Cited

U.S. PATENT DOCUMENTS

| | | | | |
|---|---|---|---|---|
| 4,794,432 A | * | 12/1988 | Yilmaz et al. | 257/337 |
| 6,153,451 A | * | 11/2000 | Hutter et al. | 438/197 |
| 6,472,723 B1 | * | 10/2002 | Jarstad et al. | 257/659 |
| 6,864,533 B2 | * | 3/2005 | Yasuhara et al. | 257/342 |
| 7,560,782 B2 | * | 7/2009 | Pellizzer et al. | 257/378 |
| 7,799,678 B2 | * | 9/2010 | Kropewnicki et al. | 438/667 |
| 7,851,393 B2 | | 12/2010 | Sohn et al. | |
| 8,053,902 B2 | * | 11/2011 | Chen et al. | 257/776 |
| 8,253,234 B2 | * | 8/2012 | Barowski et al. | 257/691 |
| 8,344,512 B2 | * | 1/2013 | Knickerbocker | 257/773 |
| 2009/0134500 A1 | * | 5/2009 | Kuo | 257/659 |
| 2012/0161286 A1 | * | 6/2012 | Bhalla | 257/577 |
| 2013/0015502 A1 | * | 1/2013 | Fox et al. | 257/200 |

* cited by examiner

*Primary Examiner* — Eugene Lee
(74) *Attorney, Agent, or Firm* — Lowe Hauptman & Ham, LLP

(57) ABSTRACT

A passive interposer apparatus with a shielded through silicon via (TSV) configuration is disclosed. The apparatus includes a p-doped substrate, wherein at least an upper portion of the p-doped substrate is heavily p-doped. An interlayer dielectric layer (ILD) is disposed over the upper portion of the p-doped substrate. A plurality of through silicon vias (TSVs) are formed through the ILD and the p-doped substrate. A plurality of shielding lines disposed between the TSVs electrically couple respective second metal contact pads to the upper portion of the p-doped substrate.

20 Claims, 7 Drawing Sheets

METHOD OF SHIELDING THROUGH SILICON VIAS IN A PASSIVE INTERPOSER

BACKGROUND

Recent developments in integrated circuit (IC) design have led to the use of through silicon vias (TSVs) and other structures to form three-dimensional (3D) ICs. While this area of design has increased the density of active circuits, 3D ICs also present challenges that are not encountered, or are less problematic than, in other circuit designs. One challenge is the issue of signal coupling, or interference, between TSVs as they are placed closer and closer together. Not only is the placement of the TSV a factor, but so are the higher and higher frequencies that are being used in circuits.

One previous approach known to the inventors to prevent this interference is the use of guard rings, which results in good shielding across all frequencies. However, not all TSVs can be shielded using this approach, and thus signal integrity and performance issues can remain. The guard ring approach also requires an extra shielding layer for the connection and a relatively large routing area, which adds cost and limits the shielding path (and thus, efficiency).

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1:
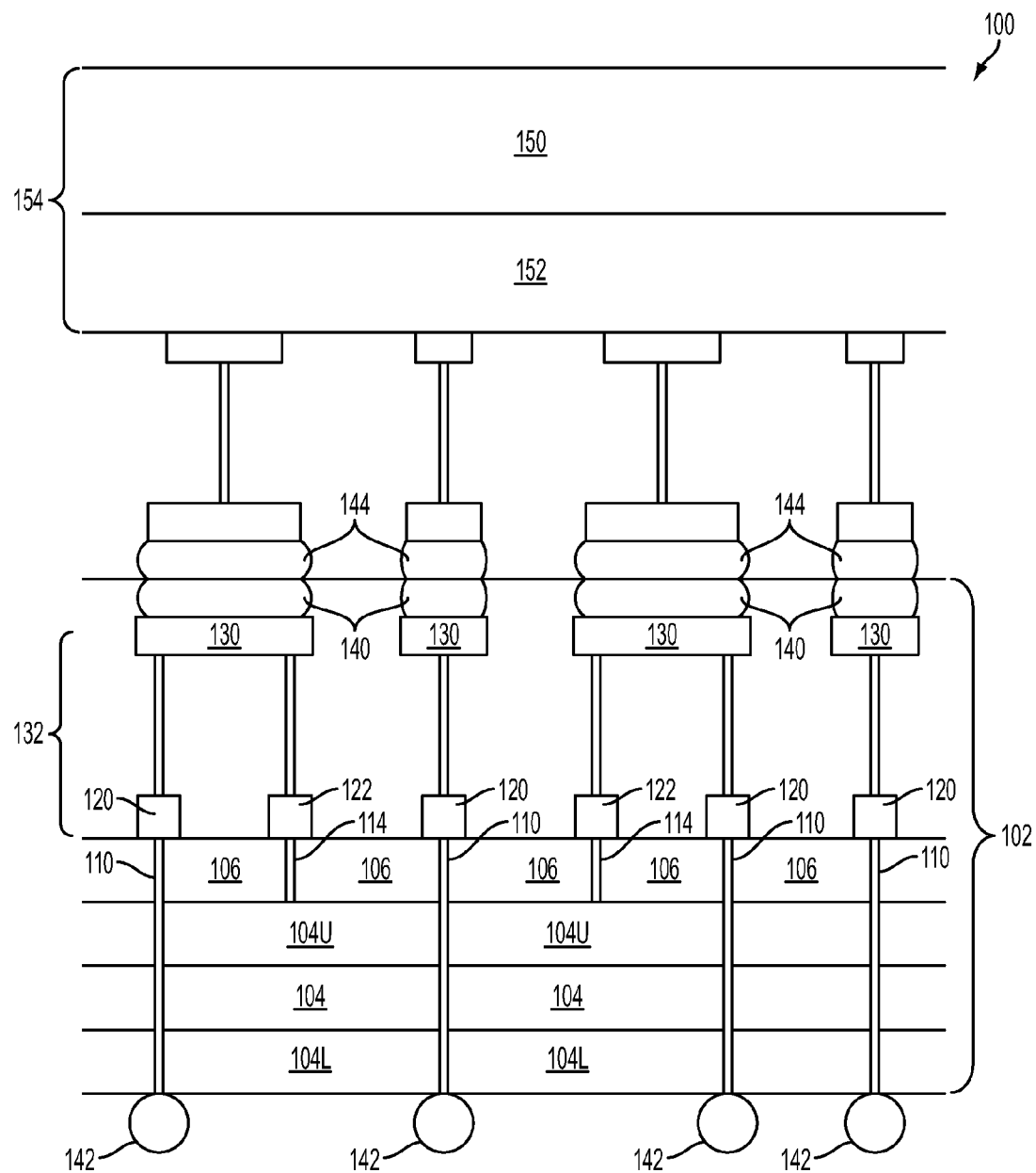
FIG. 1 is a diagram of bonded circuitry utilizing an interposer apparatus with a shielded through silicon via (TSV) configuration according to one or more embodiments.

The following disclosure provides many different embodiments, or examples, for implementing different features described below. Specific examples of components and arrangements are described below to simplify the present disclosure. These are, of course, merely examples and are not intended to be limiting. For example, various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Past methods known to the inventors for shielding through silicon vias (TSVs) utilize guard rings. In contrast with prior approaches, a solution according to one or more embodiments of the present disclosure allows for shielding of more TSVs, and thus improves performance. Likewise, the interposer of the present disclosure also reduces the routing area needed and reduces the need for extra shielding layers, thereby reducing costs.

FIG. 1 is a diagram of bonded circuitry 100 utilizing an interposer apparatus 102 with a shielded through silicon via (TSV) configuration according to one or more embodiments. Throughout the remainder of the description, the interposer will also be referred to as a passive interposer, which is used to convey a lack of active circuits included therein. The interposer apparatus 102 has a substrate 104, which is a p-doped semiconductor substrate. In some embodiments, substrate 104 (or interposer substrate 104) is a silicon wafer doped with boron. Alternatively, substrate 104 is a semiconductor wafer comprised of germanium, strained or un-strained silicon-germanium, gallium arsenide, and/or other suitable semiconductor materials. Substrate 104 is doped by any suitable process, such as in-situ doping, a diffusion process, an ion implantation process, or other doping process.

The passive interposer 102 also has an upper substrate portion 104U and a lower substrate portion 104L that are heavily p-doped regions of substrate 104. In some embodiments, the heavily doped regions 104U and 104L are formed by ion implantation performed on the previously doped substrate 104. In other embodiments other suitable processes are used to further dope upper portion 104U and lower portion 104L.

Above the heavily doped portion 104U of substrate 104 is an interlayer dielectric (ILD) 106. Interlayer dielectric 106 is a layer formed to electrically isolate additional interconnect layers above the substrate 104 from the substrate. Exemplary suitable materials for ILD 106 include silicon dioxide, silicon nitride, and silicon oxynitride. Alternatively, ILD 106 is comprised of an organic or inorganic high-k material (e.g., a spin-on material). In some embodiments, the dielectric constant of ILD 106 is at least 3.9. In other embodiments, the dielectric constant of ILD 106 is greater than 3.9. ILD 106 is formed using chemical vapor deposition (CVD), low pressure chemical vapor deposition (LPCVD), metal organic chemical vapor deposition (MOCVD), spin-on processing, and/or any other suitable process.

TSVs 110 are formed through the substrate 104 and ILD 106 and are comprised of a good conductive material, such as copper. Alternatively, a different material such as tungsten, aluminum, or titanium may be used. TSVs 110 have a barrier layer and a seed layer, which are not shown or numbered, lining channels in which TSVs 110 are formed. For instance, a barrier layer is deposited by a chemical vapor deposition (CVD) process for a material such as Ti, Ta, TiN, or TaN. A copper seed layer is then deposited, before an electroplating or electro-less plating process is used to fill the channels with a copper material. In some embodiments, a chemical mechanical polish (CMP) process is performed to planarize the top surface of TSVs 110 to the same level as the top surface of ILD 106 or the bottom surface of TSVs 110 to the same level as the bottom surface of the substrate.

Shielding lines 114 are formed through ILD 106 and are likewise comprised of a good conductive material, such as copper. Rather than forming a channel through the entirety of interposer 102, however, shielding lines 114 only connect the top surface of upper substrate portion 104U to interconnect structures formed above ILD 106. In one or more embodiments, shielding lines 114 are formed by similar processes as TSVs 110, which are mentioned above and are not repeated here for brevity. As such, shielding lines 114 may have a liner or barrier layer, and a seed layer, which is neither numbered nor shown. Shielding lines 114 are disposed between TSVs so as to reduce coupling and/or interference between TSVs.

Contact pads 120 and 122 are formed above ILD 106 and are the lowest features of an interconnect structure 132 located in passive interposer 102. Pads 120 are in direct contact with TSVs 110, while pads 122 are in direct contact with shielding lines 114. Interconnect pads 130 are electrically coupled to both the contact pads 120 and 122, as well as bump structures 140. There may be an additional number of interconnect layers and structures connecting contact pads 120 and 122 with interconnect pads 130. The conductive elements of interconnect structure 132 will comprise materials such as copper, aluminum, titanium, tungsten, tantalum, platinum, erbium, palladium, silicides thereof, nitrides thereof, combinations thereof, and/or other suitable materials. Bump structures 140 electrically connect the interconnect structures of passive interposer 102 and corresponding features of an active semiconductor wafer 154 described in further detail below. Passive interposer 102 can be adjusted to exhibit a particular voltage potential, such as ground or power, from input to output.

As part of an active semiconductor wafer 154, bump structures 144 provide electrical connections for active circuitry 152 (although the particulars of the connection between the two are not shown or numbered for clarity), which is further connected to substrate 150. Active circuitry is used to describe a group of circuits which are used to implement semiconductor devices which also require an additional power signal. Exemplary devices include transistors or active pixel image sensors. Bump structures 144 and bump structures 140 are bonded together to electrically couple interposer 102 to semiconductor wafer 154. Thus, with the TSVs 110 of interposer 102 electrically coupled to active circuitry 152, the circuits in the semiconductor wafer are bonded to additional structures or circuits below the interposer, such as another active-circuit wafer, by using bumps 142.

Figure 2A:
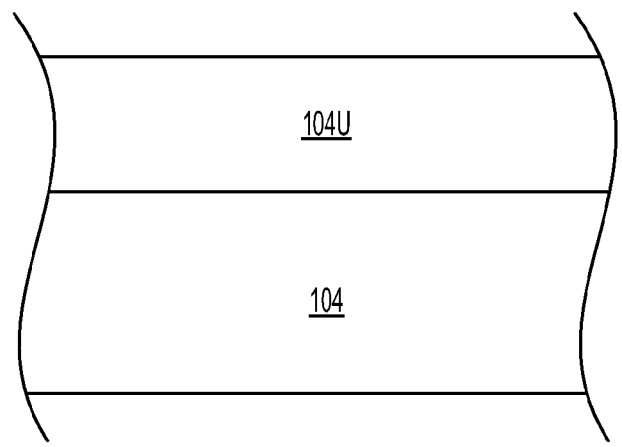
FIGS. 2A-E are partial diagrams of an interposer apparatus with a shielded TSV configuration during various stages of manufacture according to one or more embodiments.
Figure 2B:
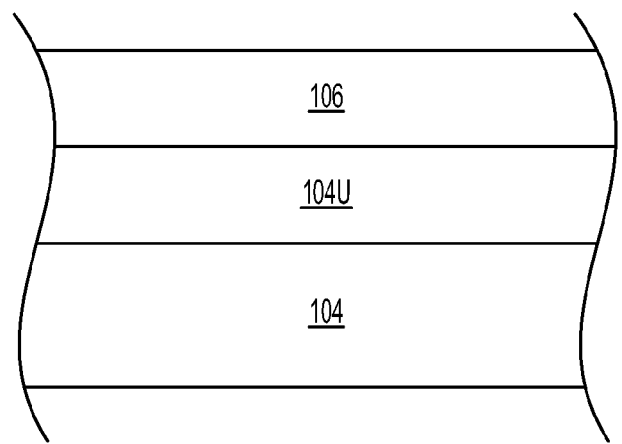

FIGS. 2A-E are partial diagrams of interposer 102 with a shielded TSV configuration during various stages of manufacture according to some one or more embodiments. In FIG. 2A, a p-doped substrate 104 is the basis for passive interposer 102. A heavily-doped upper portion 104U is formed when additional boron ions are implanted through a suitable implantation process. FIG. 2B depicts the embodiment of FIG. 2A after the formation of an interlevel dielectric 106, which is deposited above upper portion 104U. ILD 106 is deposited using a suitable deposition technique, such as CVD, PECVD, LPCVD, MOCVD, or the like.

Figure 2C:
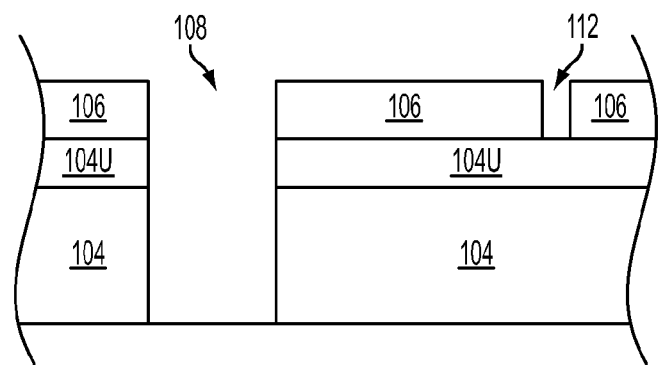

In FIG. 2C, trenches 108 and 112 (alternatively referred to as channels) are formed in or through by a suitable process in order to later be filled and used as a TSV and a shielding line, respectively. Trenches 108 and 112 may be formed through placement of one or more masks and utilization of photolithography processes. In place of or in conjunction with photolithography, wet or dry etching processes may be used.

Figure 2D:
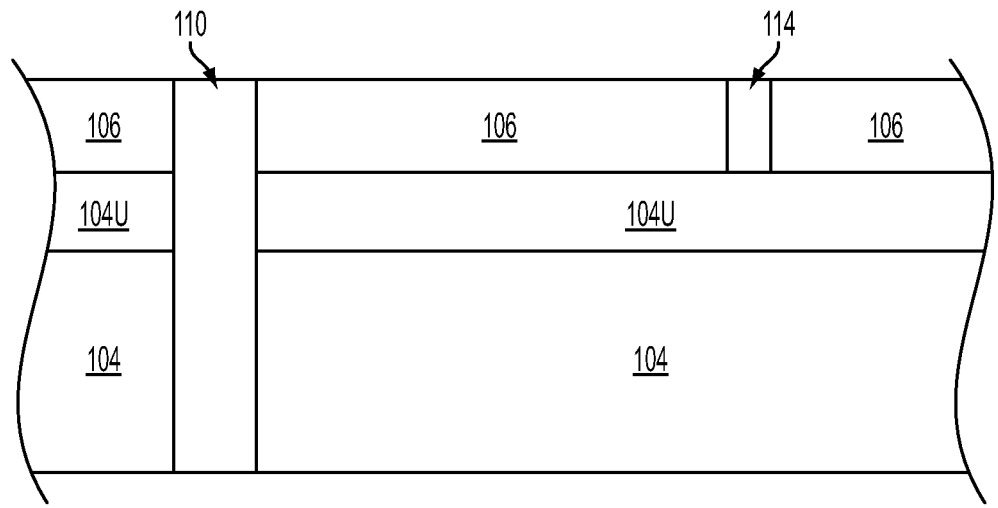
Figure 2E:
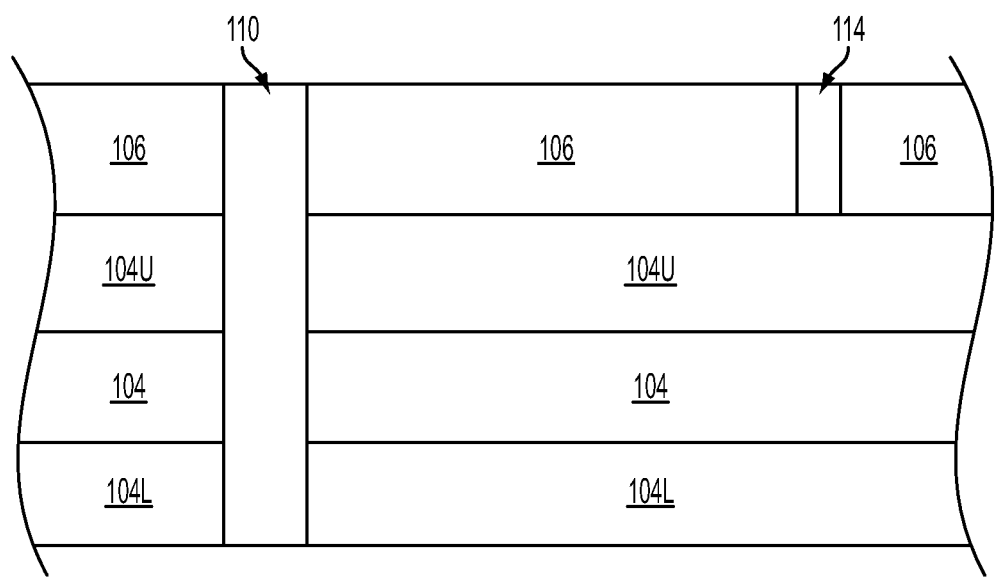

In FIG. 2D, trenches 108 and 112 are filled with a conductive material, such as copper, to form TSV 110 and shielding line 114, respectively. Not shown, but potentially part of the filling process is the deposition of a barrier layer, such as Ti, Ta, TiN, TaN, or other suitable materials by a CVD process, on the wall(s) of trenches 108 and 112. A wetting layer (i.e., seed layer) of copper may also be deposited before the TSV 110 and the shielding line 114 are filled. Then, an electroplating or electro-less plating process is used to fill trenches 108 and 112 to form TSV 110 and shielding line 114. A chemical mechanical polishing (CMP) technique may be used to planarize the structure for further processing (i.e., additional deposition forming interconnect structures and bump structures). FIG. 2E shows heavy doping of the lower portion 104L of the substrate, such as through ion implantation.

Figure 3:
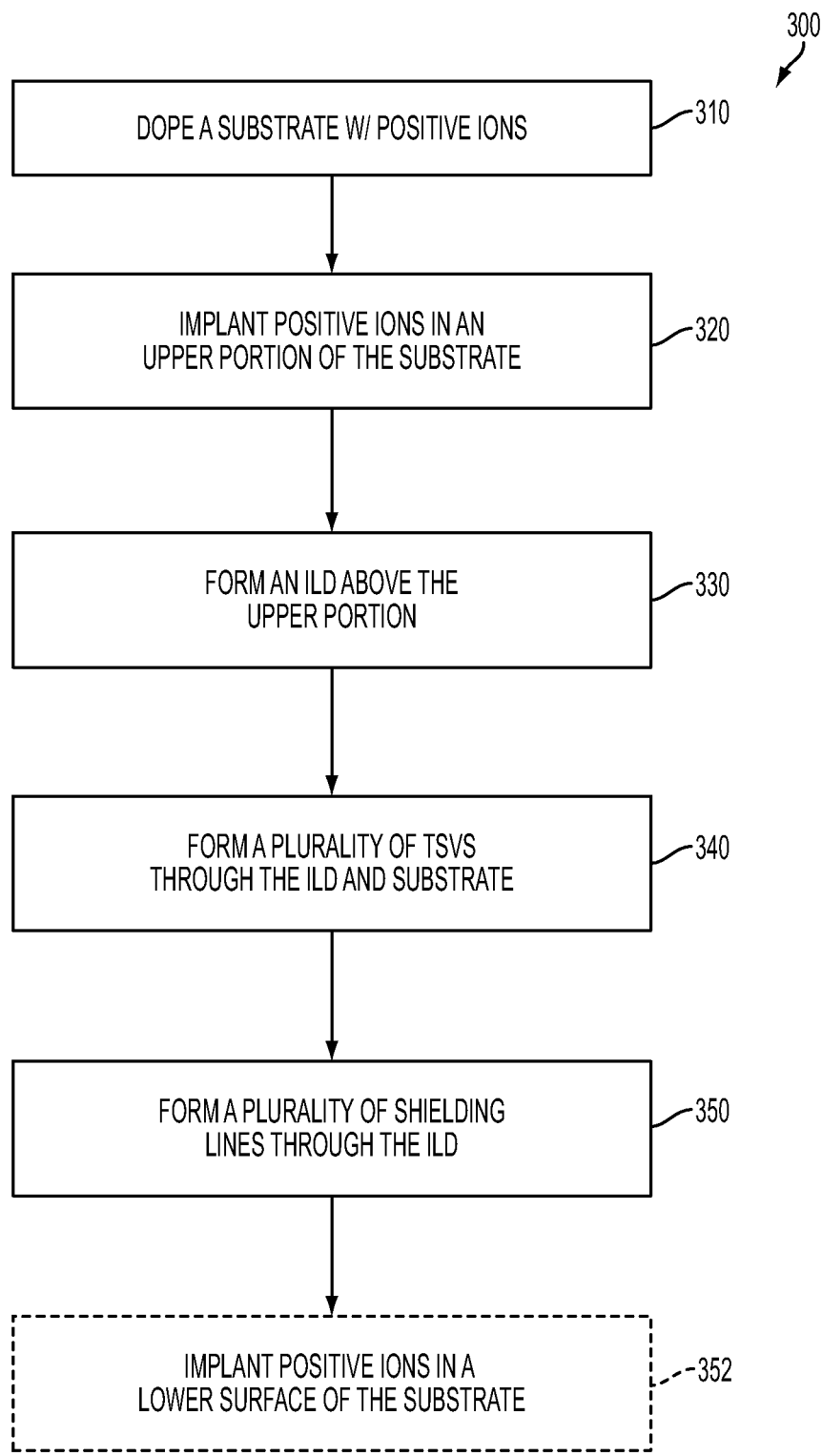
FIG. 3 is a flowchart of a method of shielding TSVs in a passive interposer according to one or more embodiments.

FIG. 3 is a flowchart of a method 300 of shielding TSVs in a passive interposer according to one or more embodiments. At a step 310, a substrate of an interposer (e.g., substrate 104) is doped with positive ions, which results in a p-doped substrate. The interposer is doped with a group V element, such as boron, through a diffusion process, in-situ doping, ion implantation, and/or another suitable process.

At a step 320, positive ions are implanted in an upper portion of the substrate, resulting in a heavily p-doped portion of the substrate, e.g., upper portion 104U. At a step 330, an interlayer dielectric, e.g., ILD 106, is formed above the upper portion of the substrate by a suitable CVD process, such as those mentioned above.

At a step 340, TSVs (e.g., TSVs 110) are formed through the ILD and the doped substrate. The TSVs that are formed are configured to electrically connect structures above and below the substrate. In some embodiments, the coupled structures are interconnect structures above and bump structures below the substrate. In other embodiments, other electrical connections between structures are made. The formation of TSVs in step 340 is accomplished by forming a trench, e.g., trench 108, through the ILD and doped substrate (by photolithography, etching, or both), depositing by CVD a barrier layer, such as TiN, and electroplating the trench with copper. Other suitable techniques for formation of the TSVs may be used.

At a step 350, shielding lines are formed through the ILD, which are configured to electrically couple the upper portion of the substrate to an interconnect structure. In some embodiments, the shielding line formation is substantially similar to step 340 with regard to the materials and techniques used. In step 350, the trench formed through the ILD 106 extends to the heavily doped upper portion of the interposer substrate and not to the remainder of substrate 102.

At an optional step 352, positive ions are implanted in a lower portion of the substrate as well. Thus, if step 352 is omitted, the interposer substrate has a p-doped portion and a heavily p-doped portion. If step 352 is performed, the interposer substrate has a center portion that is p-doped and upper and lower portions, which are heavily p-doped.

Figure 4A:
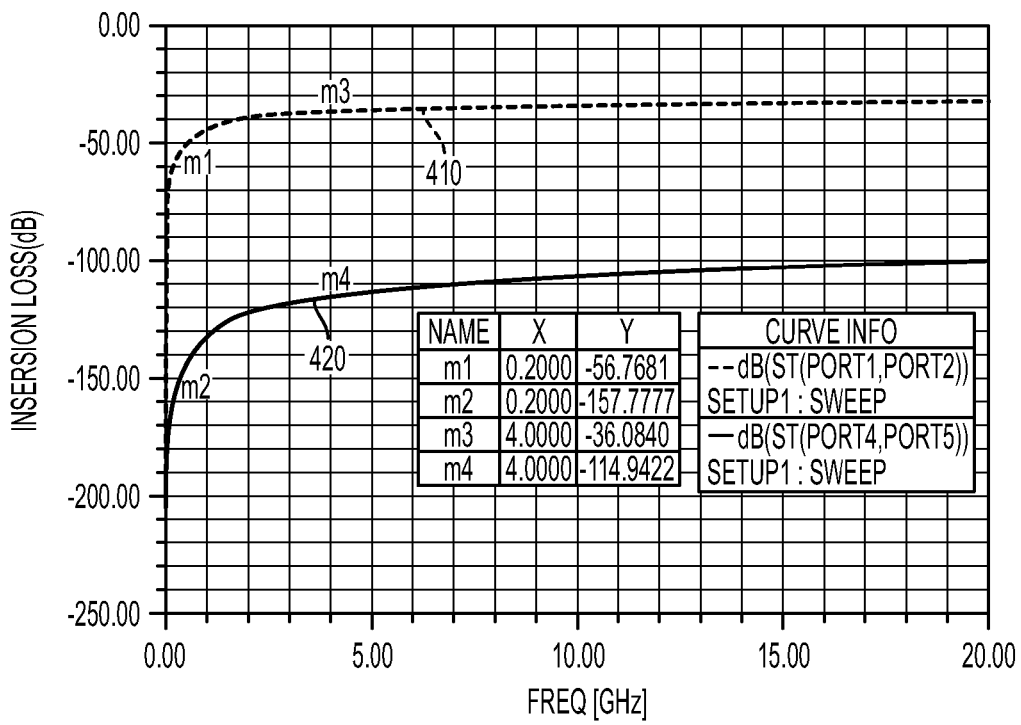
FIGS. 4A-4C are graphs of coupling characteristics of shielded and unshielded interposer substrates.
Figure 4B:
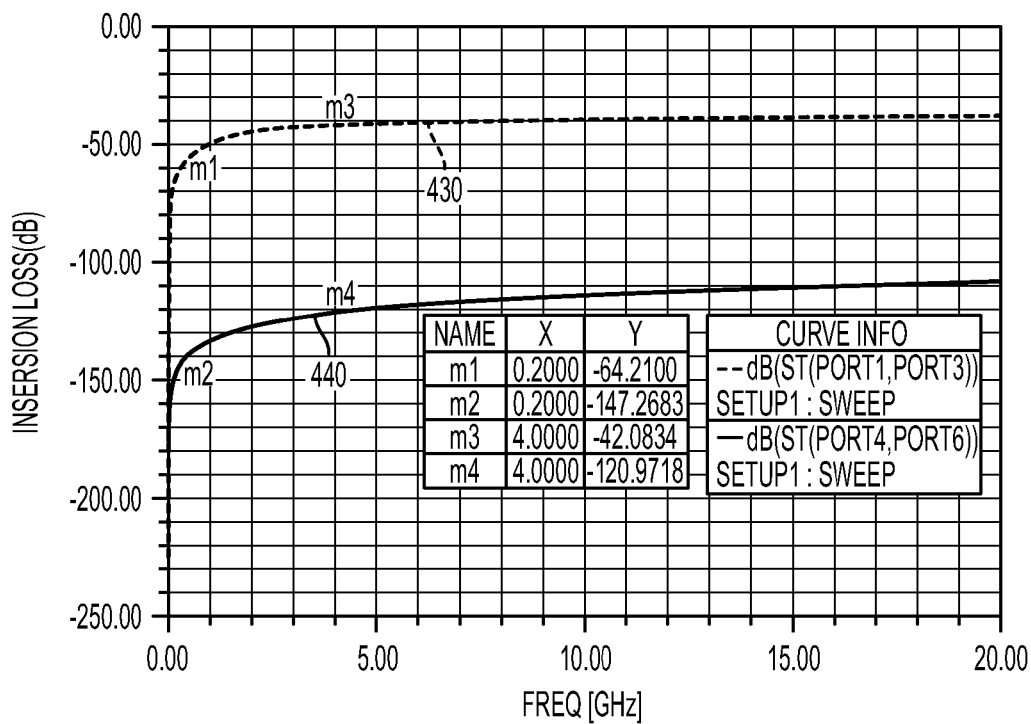
Figure 4C:
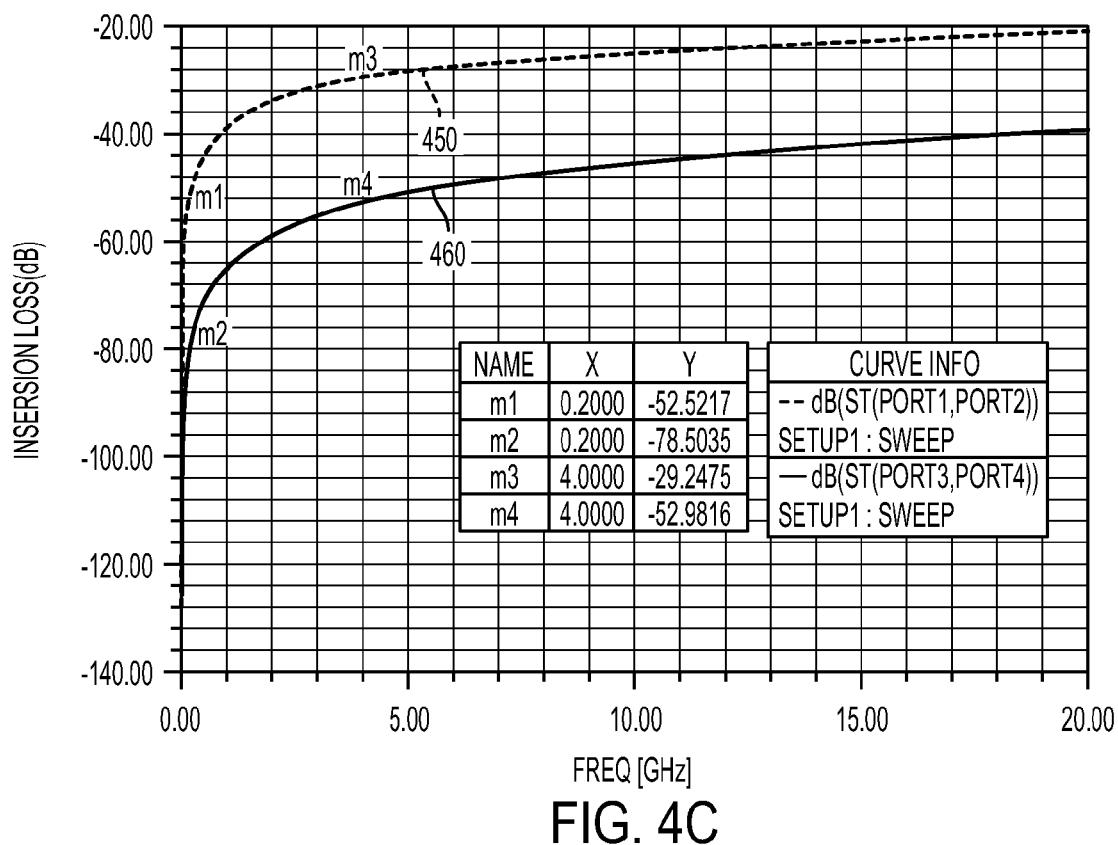

FIGS. 4A-4C are graphs of coupling characteristics of shielded and unshielded interposer substrates according to one or more embodiments. Each of the three graphs has an x-axis representing the frequency of the signal present in the interposer and has a y-axis representing the insertion loss (in decibels) of the signal. The individual graphs show the decoupling effects of the shielded interposer with respect to three different structures in the active wafer and in the passive interposer.

In FIG. 4A, the insertion loss between a first metallization layer (M1) (i.e., first layer of a interconnect structure) and the first metallization layer in a bonded device (MB) is shown. In this graph, a curve 410 represents the unshielded substrate and a curve 420 represents the shielded substrate. The insertion loss in decibels is significantly reduced across the shown frequencies, two specific frequencies of which are marked in the graph. For example, the insertion losses at 200 megahertz (MHz) and 4 gigahertz (GHz) are approximately three times as large without shielding than with shielding. In FIG. 4B, adjacent first metallization structures (M1 and M1) are shown with an unshielded curve 430 and a shielded curve 440. The losses are reduced by a multiple of more than two times. In FIG. 4C, an unshielded curve 450 and a shielded curve 460 show a nearly 50% reduction with regard to isolating the first interconnect structure and TSVs.

Figure 5:
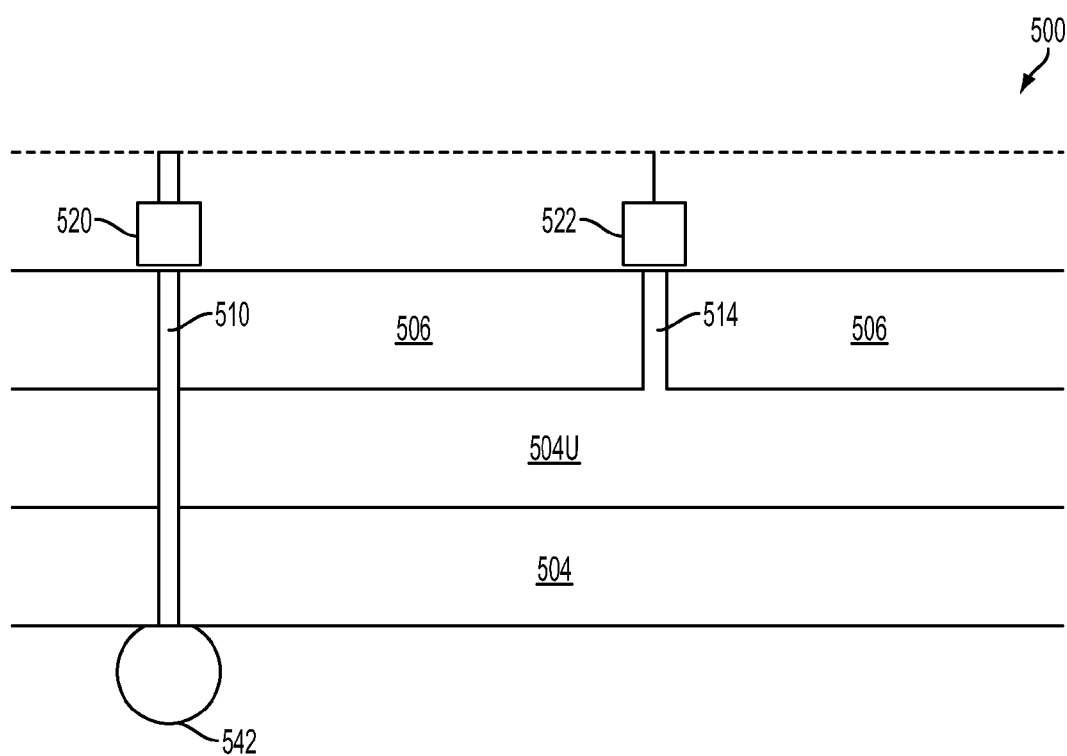
FIG. 5 is a diagram of bonded circuitry utilizing an interposer apparatus with a shielded through silicon via (TSV) configuration according to one or more other embodiments.

FIG. 5 is a simplified diagram of an interposer apparatus 502 with a shielded TSV configuration according to another embodiment. Similar to FIG. 1, an interposer substrate 504 is shown. In this embodiment, however, the interposer 502 comprises a p-doped substrate 504 and a heavily p-doped upper portion 504U and does not comprise a heavily p-doped lower portion in contrast with the FIG. 1 embodiment). A TSV 510 and a shielding line 514 are shown that are substantially similar to TSV 110 and shielding line 114 shown in FIG. 1.

An ILD 506 isolates the substrate from interconnect structures, which include contact pads 520 and 522. TSV 510 electrically couples contact pad 520 and a bump structure 542, while shielding line 514 electrically couples contact pad 522 and the upper substrate portion 504. The operation of passive interposer 502 is substantially similar to that of FIG. 1 without needing to perform the additional step of heavily doping the lower portion of the substrate (e.g., through ion implantation of additional boron atoms). Passive interposer 502 is configurable to have a particular voltage potential, such as ground or power, from input to output.

A passive interposer apparatus with a shielded through silicon via (TSV) configuration is disclosed. The apparatus includes a p-doped substrate, wherein at least an upper portion of the p-doped substrate is heavily p-doped. An interlayer dielectric layer (ILD) is disposed over the upper portion of the p-doped substrate. A plurality of through silicon vias (TSVs) are formed through the ILD and the p-doped substrate, such that the plurality of TSVs electrically couple respective first metal contact pads above the ILD to a first set of bump structures below the p-doped substrate. A plurality of shielding lines electrically couple respective second metal contact pads to the upper portion of the p-doped substrate, such that the shielding lines are disposed between the plurality of TSVs.

Also disclosed is a method of shielding through silicon vias (TSVs) in a passive interposer. The method includes doping a substrate with positive ions. Positive ions are implanted in an upper portion of the substrate, such that the substrate has at least a p-doped portion and a heavily p-doped upper portion. An interlayer dielectric (ILD) is formed above the heavily p-doped upper portion. A plurality of through silicon vias (TSVs) is formed through the ILD and the substrate, such that at least one structure above and below the passive interposer are configured to be electrically coupled to one another by the passive interposer. A plurality of shielding lines is formed through the interlayer dielectric configured to electrically couple the heavily p-doped upper portion of the substrate and at least one structure above the passive interposer, wherein the shielding lines are formed between the plurality of TSVs.

An integrated circuit device configured to reduce signal coupling between through silicon vias (TSVs) is disclosed. The device includes a first semiconductor wafer having a substrate portion and an active circuitry portion. The active circuitry portion is electrically coupled to bump structures configured for bonding to a passive interposer. A passive interposer without active circuitry is also included in the device. The interposer includes a p-doped substrate. The p-doped substrate has an upper portion and a lower portion. Each portion is heavily doped. The substrate also has a central portion that is moderately doped. The interposer also includes an interlayer dielectric (ILD) above the upper portion of the p-doped substrate. The interposer further includes a plurality of through silicon vias (TSVs) formed through the ILD and the p-doped substrate. The plurality of TSVs is configured to electrically couple an interconnect structure above the ILD and a bump structure below the p-doped substrate. A plurality of shielding lines is configured to electrically couple the metallization structure above the ILD and the heavily doped upper portion of the p-doped substrate.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A passive interposer apparatus with a shielded through silicon via (TSV) configuration, the apparatus comprising:
    a p-doped substrate, wherein at least an upper portion of the p-doped substrate is heavily p-doped and extends substantially across an entirety of the p-doped substrate;
    an interlayer dielectric layer (ILD) disposed over the upper portion of the p-doped substrate;
    a plurality of through silicon vias (TSVs) formed through the ILD and the p-doped substrate, wherein the plurality of TSVs electrically couple respective first metal contact pads above the ILD to a first set of bump structures below the p-doped substrate; and
    a plurality of shielding lines electrically coupling respective second metal contact pads to the upper portion of the p-doped substrate, wherein the shielding lines are disposed between adjacent TSVs of the plurality of TSVs.

2. The apparatus of claim 1, wherein the first metal contact pads and the second metal contact pads are electrically coupled to a second set of bump structures at an upper edge of the passive interposer.

3. The apparatus of claim 1, further comprising at least one or more interconnect layers formed above the first metal contact pads and the second metal contact pads and below the second set of bump structures.

4. The apparatus of claim 3, wherein the second set of bump structures are configured to electrically couple the TSVs to a wafer having active circuitry for a semiconductor device.

5. The apparatus of claim 1, wherein the TSVs are coupled directly to the first set of bump structures below the p-doped substrate.

6. The apparatus of claim 1, wherein the passive interposer is configured to be biased.

7. The apparatus of claim 1, wherein the p-doped substrate has a heavily p-doped lower portion below a moderately p-doped center portion.

8. The apparatus of claim 7, wherein the first metal contact pads and the second metal contact pads are electrically coupled to a second set of bump structures at an upper edge of the passive interposer.

9. The apparatus of claim 8, wherein at least one or more interconnect layers are formed above the first metal contact pads and the second metal contact pads and below the second set of bump structures.

10. The apparatus of claim 9, wherein the second set of bump structures are configured to electrically couple the TSVs to a wafer having active circuitry for a semiconductor device.

11. The apparatus of claim 7, wherein the TSVs are coupled directly to the first set of bump structures below the p-doped substrate.

12. The apparatus of claim 7, wherein the passive interposer is configured to be biased.

13. An integrated circuit device configured to reduce signal coupling between through silicon vias (TSVs), the device comprising:
    a first semiconductor wafer having a substrate portion and an active circuitry portion, wherein the active circuitry portion is electrically coupled to bump structures configured for bonding to a passive interposer; and a passive interposer without active circuitry, wherein the interposer includes
   a p-doped substrate, wherein the p-doped substrate has an upper portion and a lower portion that are each heavily doped, and has a central portion that is moderately doped;
   an interlayer dielectric (ILD) above the upper portion of the p-doped substrate;
   a plurality of through silicon vias (TSVs) formed through the ILD and the p-doped substrate, where the plurality of TSVs are configured to electrically couple an interconnect structure above the ILD and a bump structure below the p-doped substrate;
   a plurality of shielding lines configured to electrically couple the interconnect structure above the ILD and the heavily doped upper portion of the p-doped substrate; and
   at least one TSV of the plurality of TSVs and at least one shielding line of the plurality of shielding lines connect to one or more interconnect layers formed above the first and second metal contact pads.

14. The device of claim 13, wherein the passive interposer is configured to be biased.

15. An interposer having a shielded through silicon via (TSV) configuration, the interposer comprising:
   a p-doped substrate, wherein at least an upper portion of the p-doped substrate is heavily p-doped;
   an interlayer dielectric layer (ILD) disposed over the upper portion of the p-doped substrate;
   a first TSV formed through the ILD and the p-doped substrate, the first TSV coupled to a first metal contact pad above the ILD and a first bump structure below the p-doped substrate;
   a second TSV formed through the ILD and the p-doped substrate, the second TSV coupled to a second metal contact pad above the ILD and a second bump structure below the p-doped substrate;
   a shielding line disposed between the first TSV and the second TSV, the shielding line coupled to a third metal contact pad above the ILD and a top surface of the upper portion of the p-doped substrate; and
   the first TSV and the shielding line are connected to a first interconnect pad.

16. The interposer of claim 15, further comprising an interconnect contact pad, the interconnect contact pad coupled to the first metal contact pad and the third metal contact pad.

17. The interposer of claim 15, wherein a material of the first TSV is substantially the same as a material of the shielding line.

18. The interposer of claim 15, wherein each of the first TSV and the second TSV comprise:
   a conductive layer;
   a seed layer disposed between the conductive layer and the ILD and between the conductive layer and the p-doped substrate; and
   a barrier layer disposed between the seed layer and the ILD and between the seed layer and the p-doped substrate.

19. The interposer of claim 15, wherein the p-doped substrate further comprises a lower portion, lower portion is heavily p-doped, and the lower portion is spaced from the upper portion.

20. The interposer of claim 15, wherein the ILD comprises a high-k dielectric material, the high-k dielectric material having a dielectric constant greater than 3.9.

* * * * *